United States Patent
Nakayama

(10) Patent No.: US 7,035,448 B2
(45) Date of Patent: *Apr. 25, 2006

(54) METHOD OF DEFECT INSPECTION OF GRAYTONE MASK AND APPARATUS DOING THE SAME

(75) Inventor: Kenji Nakayama, Kumamoto (JP)

(73) Assignee: Hoya Corporation, Tokyo (JP)

( * ) Notice: Subject to any disclaimer, the term of this patent is extended or adjusted under 35 U.S.C. 154(b) by 649 days.

This patent is subject to a terminal disclaimer.

(21) Appl. No.: 10/107,820

(22) Filed: Mar. 28, 2002

(65) Prior Publication Data
US 2003/0035575 A1   Feb. 20, 2003

(30) Foreign Application Priority Data
Aug. 20, 2001   (JP)   .......................... P. 2001-248650

(51) Int. Cl.
    G06K 9/00   (2006.01)
(52) U.S. Cl. .................. 382/145; 382/147; 382/149; 356/237.5
(58) Field of Classification Search ................ 382/141, 382/144, 149, 145, 147; 356/310, 237.1, 356/237.2, 237.4, 237.5; 438/736; 348/86, 348/125, 126; 430/5, 269
See application file for complete search history.

(56) References Cited

U.S. PATENT DOCUMENTS

| | | | |
|---|---|---|---|
| 6,436,802 B1 * | 8/2002 | Khoury | 438/612 |
| 6,529,621 B1 * | 3/2003 | Glasser et al. | 382/144 |
| 6,714,670 B1 * | 3/2004 | Goldsworthy et al. | 382/149 |

* cited by examiner

Primary Examiner—Bhavesh M. Mehta
Assistant Examiner—John Strege
(74) Attorney, Agent, or Firm—Sughrue Mion, PLLC

(57) ABSTRACT

A comparative inspection technique is employed for detecting defects by comparing similar patterns formed in a mask. As thresholds of information appearing according to the pattern difference, a special graytone-defect extracting threshold in addition to thresholds for extracting ordinary defects in a opaque and a transmission part is newly provided. Further, by distinguishing a case of inspecting an area wherein the opaque and transmission parts are formed from a case of inspecting an area wherein a graytone part is formed, so that inspection is made by using the thresholds for extracting ordinary defects in the opaque and transmission parts in the case of inspecting the opaque and the transmission parts and that inspection is made by using the special graytone-defect extracting threshold in the case of inspecting the graytone part.

10 Claims, 5 Drawing Sheets

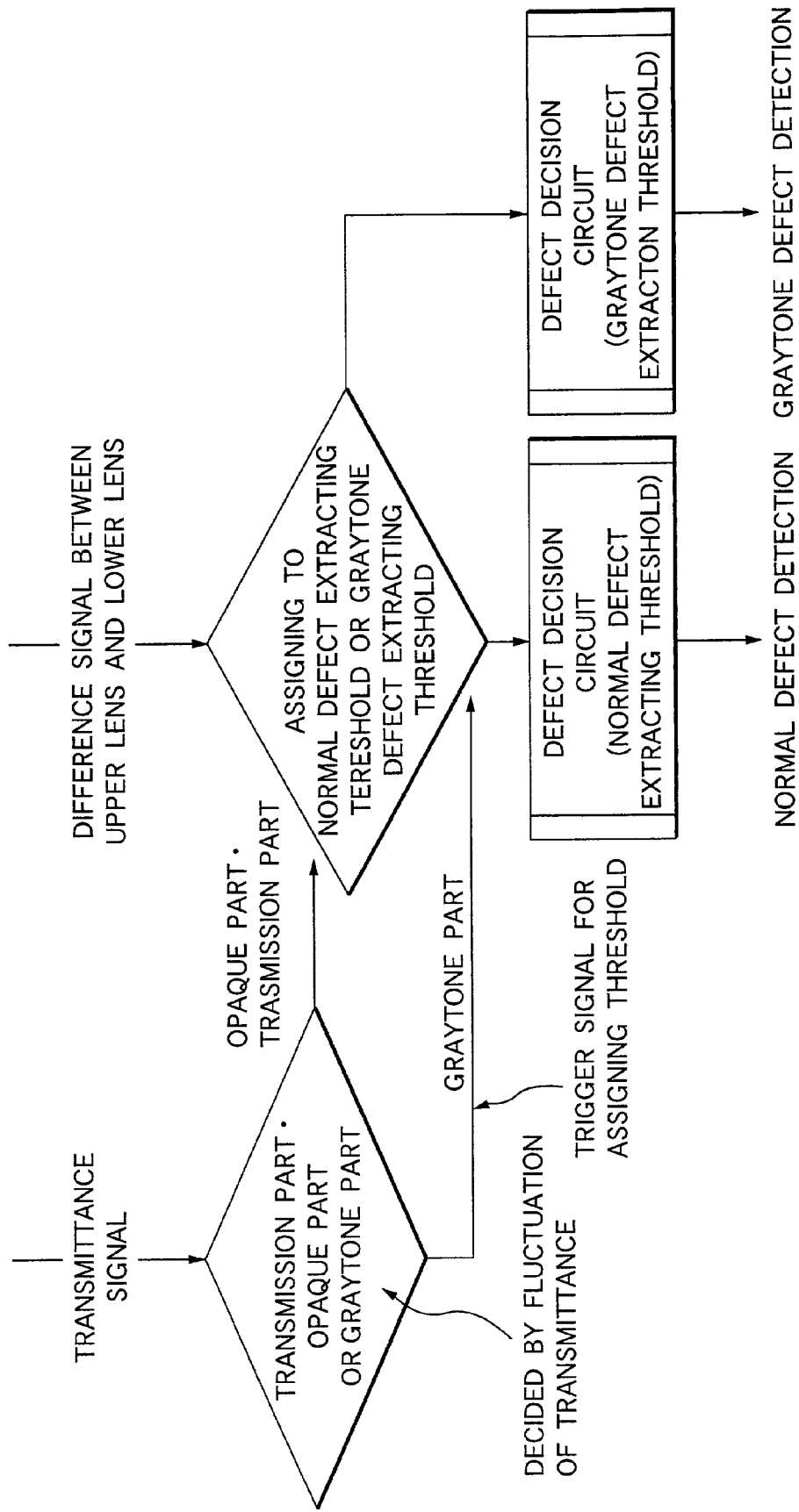

LENS (CCD LINE SENSOR)

9a: DEFECT EXTRACTION THRESHOLD: +SIDE (CLEAR DEFECT)

9b: DEFECT EXTRACTING THRESHOLD: −SIDE (OPAQUE DEFECT)

METHOD OF DEFECT INSPECTION OF GRAYTONE MASK AND APPARATUS DOING THE SAME

BACKGROUND OF THE INVENTION

1. Field of the Invention

The present invention relates to a method of defect inspection of a graytone mask and an apparatus doing the same.

2. Description of the Related Art

In recent years, attempts have been made to cut down the number of mask sheets by using graytone masks in the field of large-sized LCD masks (as set forth in the monthly FPD Intelligence, May, 1999).

As shown in FIG. 4A, such a graytone mask has a opaque part 1, a transmission part 2 and a graytone part 3 on a transparent substrate. The graytone part 3 corresponds to an area in which a opaque pattern 3a of not exceeding the resolution limit of an exposure apparatus for a large-sized LCD using the graytone mask is formed, for example, and is designed to selectively change the thickness of a photoresist film by decreasing the light transmitted through this area so as to decrease the amount of irradiation due to the area, 3b showing a microscopic transmission part of not exceeding the resolution limit of the exposure apparatus in the graytone part 3. Normally, the opaque part 1 and the opaque pattern 3a are formed with films that are made of the same material such as chromium (Cr) or a chromium compound and have the same thickness. The transmission part 2 and the microscopic transmission part 3b are transparent substrate parts, each without having a opaque film on the transparent substrate. The resolution limit of the exposure apparatus for the large-sized LCD using the graytone mask is about 3 µm in the case of an exposure apparatus of a stepper type and about 4 µm in the case of an exposure apparatus of a mirror projection type. Consequently, the space width of a transmission part 3b in the graytone part 3 of FIG. 4A is set at less than 3 µm and the line width of the opaque pattern 3a of not exceeding the resolution limit of the exposure apparatus is set at less than 3 µm, for example. When the exposure apparatus for the large-sized LCD is used for light exposure, as the exposure light transmitted through the graytone part 3 as a whole is deficient in the amount of light exposure, positive photoresists are left on a substrate though the thickness of the positive photoresists exposed to light via the graytone part 3 solely decreases. More specifically, there arises a difference in solubility of resists in developing liquid between parts corresponding to the ordinary opaque part 1 and to the graytone part because of difference in the amount of light exposure and this results in, as shown in FIG. 4B, making apart 1' corresponding to the ordinary opaque part 1 as thick as about 1.3 µm, making a part 3' corresponding to the graytone part 3 as thick as about 0.3 µm and making a part corresponding to the transmission part 2 a part 2' without resists, for example. A first etching of a substrate as a workpiece is carried out in the part 2' without the resists so as to remove the resists in the thin part 3' corresponding to the graytone part 3 by ashing and the like and by carrying out a second etching of this part, the etching process is performed with one sheet of mask instead of two sheets of masks as conventionally used in order to cut down the number of masks for use.

A conventional method of inspection of a mask having only opaque and transmission parts will now be described.

FIG. 7A shows a condition in which a clear defect 4 (pinhole) and a opaque defect 5 (spot) are produced in a opaque part 1 and a transmission part 2 respectively with both parts being scanned by one of the lenses (hereinafter called an upper lens) of a comparative inspection apparatus as shown by an arrow.

FIG. 7B shows an amount-of-transmission signal 7 obtainable along the scanning line of the lens. The amount-of-transmission signal 7 is detected by a CCD line sensor disposed in each lens unit, for example. The level of the amount-of-transmission signal 7 is B in the opaque part 1 and W in the transmission part 2. The transmittance of the opaque part 1 is set at 0% and the transmittance of the transmission part 2 is set at 100%. The amount-of-transmission signal 7 is basically formed of a pattern edge line signal (pattern form signal) generated at the edge (boundary between the opaque part and the transmission part) of the pattern. In case where defects are produced, there appear a clear defect signal 4' generated in the opaque part 1 and a opaque defect signal 5' generated in the transmission part 2.

FIG. 7C shows an amount-of-transmission signal 7' obtainable by the other lens (hereinafter called a lower lens) in case where no defect is produced even in the same pattern as that of FIG. 7A.

FIG. 7D shows a difference signal 8 obtained by subtracting the amount-of-transmission signal (a different portion) of each lens; more specifically, there is shown therein a difference signal obtained by subtracting the amount-of-transmission signal 7' of FIG. 7C from the amount-of-transmission signal 7 of FIG. 7B. In the difference signal 8, only defect signals 4' and 5' are extracted because a pattern edge line signal is removed from the amount-of-transmission signal of each lens.

FIG. 7E shows a condition in which with the setting of thresholds necessary for extracting defects in the opaque part 1 and the transmission part 2 in the difference signal 8 that has extracted only defect signals, the clear defect is detected by a plus-side threshold 9a and the opaque defect is detected by a minus-side threshold 9b. Although the detection sensitivity increases as the thresholds lower, the thresholds are needed to be set at a level on which no false defects are picked up.

In order to make sure that what kind of defect is produced in which one of the lenses, the signal of the upper lens is compared with that of the lower lens in a upper lens circuit (by subtracting the signal of the lower lens from that of the upper lens), for example, so as to detect clear and opaque defects in the upper lens because a defect signal appears on the plus side when the clear defect is produced in the opaque part 1 of the upper lens and because a defect signal appears on the minus side when the opaque defect is produced in the transmission part 2 of the upper lens (FIG. 7B-(5)). In the same way, the signal of the lower lens is compared with that of the upper lens in a lower lens circuit (by subtracting the signal of the upper lens from that of the lower lens), for example, so as to detect clear and opaque defects in the lower lens because a defect signal appears on the plus side when the clear defect is produced in the opaque part 1 of the lower lens and because a defect signal appears on the minus side when the opaque defect is produced in the transmission part 2 of the lower lens.

As the conventional comparative inspection apparatus mentioned above is a apparatus for inspecting a conventional mask only having a opaque and a transmission part, it is unable to inspect a graytone mask having a graytone part.

More specifically, in case where thresholds are set as those necessary for extracting defects in the opaque and transmission parts as stated above, the defect signal in the graytone part is weak since a pattern forming the graytone part is microscopic and since the defect itself is normally very small, so that the thresholds are too high to extract the defect in the graytone part.

On the assumption that the thresholds are set as those necessary for extracting the defect in the graytone part, the defects in the opaque and transmission parts are not extractable and moreover these false defects are not distinguishable from the defect of the graytone part since false defects in the opaque and transmission parts are picked up, so that no defect in the graytone part can be inspected.

Further, only one line of the defect extracting threshold is allowed to be set on the plus side and on the minus side.

SUMMARY OF THE INVENTION

An object of the invention is to provide a method of defect inspection of a graytone mask having a graytone part and an apparatus doing the same.

The following arrangements are made according to the invention.

(Arrangement 1) A method of defect inspection of a graytone mask having a opaque part, a transmission part and a graytone part aimed at selectively varying the thickness of a photoresist film by decreasing the amount of light transmitted through an area wherein the amount of light transmitted therethrough is regulated, the method being characterized by distinguishing the area wherein the opaque part and the transmission part are formed from the area wherein the graytone part is formed whereby to inspect each of the areas by using a defect inspection means fit for inspecting each of the areas.

(Arrangement 2) A method of defect inspection as described in Arrangement 1 is characterized in that the graytone part is an area wherein a opaque pattern of not exceeding the resolution limit of an exposure apparatus using the graytone mask is formed.

(Arrangement 3) A method of defect inspection of a graytone mask having a opaque part, a transmission part and a graytone part aimed at selectively varying the thickness of a photoresist film by decreasing the amount of light transmitted through an area wherein the amount of light transmitted therethrough is regulated, the method being characterized in that: a comparative inspection technique for detecting defects by comparing similar patterns formed in the mask is employed;

that as thresholds of information appearing according to the pattern difference, a special graytone-defect extracting threshold in addition to thresholds for extracting ordinary defects in the opaque and transmission parts is newly provided;

and that by distinguishing a case of inspecting an area wherein the opaque and transmission parts are formed from a case of inspecting an area wherein the graytone part is formed, so that inspection is made by using the thresholds for extracting ordinary defects in the opaque and transmission parts in the case of inspecting the opaque and the transmission parts and that inspection is made by using the special graytone-defect extracting threshold in the case of inspecting the graytone part.

(Arrangement 4) A method of defect inspection as described in Arrangement 3 is characterized in that the graytone part is an area wherein a opaque pattern of not exceeding the resolution limit of an exposure apparatus using the graytone mask is formed and that the defect extracting threshold is set at a level exceeding a base signal level characteristic of the graytone part.

(Arrangement 5) A method of defect inspection as described in Arrangement 3 is characterized in that the graytone part is an area wherein a translucent film capable of controlling the amount of light transmitted through the film is formed and that a defect extracting threshold is set at a level exceeding an allowable amount of transmission in the graytone part.

(Arrangement 6) An apparatus for defect inspection of a graytone mask having a opaque part, a transmission part and a graytone part aimed at selectively varying the thickness of a photoresist film by decreasing the amount of light transmitted through an area wherein the amount of light transmitted therethrough is regulated, the apparatus comprising:

means for detecting amount-of-transmission signals by scanning similar pattern portions formed in the mask with parallel light sources and light receiving lenses and means for obtaining a difference signal by comparing the amount-of-transmission signals;

means for identifying an area being subjected to inspection between the area covering the opaque and transmission parts and what covers the graytone part;

means for deciding the presence of defects in the opaque and transmission parts in case where the difference signal exceeds the defect extracting threshold for the opaque and transmission parts by using the defect extracting threshold therefor when it is decided that the opaque and transmission parts are being subjected to inspection; and means for deciding the presence of a defect in the graytone part in case where the difference signal exceeds the special defect extracting threshold for the graytone part by using the special defect extracting threshold therefor when it is decided that the graytone part is being subjected to inspection.

(Arrangement 7) A method of defect inspection as described in Arrangements 1 to 5 is characterized in that the graytone mask is a mask for producing a display unit.

According to Arrangements 1 and 2, the opaque and transmission parts and the graytone part can be inspected separately by distinguishing the area wherein the opaque and transmission parts are formed from the area wherein the graytone part is formed and by inspecting each of the areas by using the defect inspection means fit for inspecting each of the areas so as to make the defect of each area detectable accurately and to make the whole mask including the graytone part also detectable accurately. In this case, the defect inspection means fit for inspecting each of the areas is inclusive of what makes the reference fit for each of the areas a reference (threshold) for detecting a defect by using a method of inspection of the same kind (e.g., a comparative inspection technique) and what employs any other method of inspection fit for each of the areas. When each area is inspected by using the defect inspection means fit for inspecting each of the areas, it is preferable in view of increasing the inspection accuracy to inspect each area upon removing another area for inspection when one area is inspected. Even in this case, it may be allowed to inspect one area and another area successively, so that the inspection time can be shortened by inspecting the areas simultaneously. The method according to the invention is extremely effective in that particularly when the graytone part is an area wherein the area of not exceeding the resolution limit of an exposure apparatus using the graytone mask in case where the same defect inspection means for detecting defects in the opaque and transmission parts as well as the graytone part is used (e.g., by using the defect extracting threshold in the comparative inspection technique), because false defects are produced and this results in making it extremely difficult to detect defects in both the areas with accuracy.

According to Arrangement 3, a special graytone-defect extracting threshold in addition to thresholds for extracting ordinary defects in a opaque part and a transmission part is newly provided and a transmittance is used to decide whether the opaque and transmission parts or a graytone part is being subjected to inspection (scanning). Then a graytone mask having the opaque and transmission parts and the graytone part can collectively be inspected by deciding which one of the thresholds is to be used for inspecting purposes. It is thus possible to make sure that the whole mask including the graytone part is subjected to defect inspection.

According to Arrangement 4, when the graytone part is an area wherein a opaque pattern of not exceeding the resolution limit of an exposure apparatus using the graytone mask is formed with the defect extracting threshold being set at a level exceeding a base signal level characteristic of the graytone part, the influence of the base signal level characteristic of the graytone part can be removed. Moreover, it is possible to make sure an amount of transmission in the graytone part by setting the defect extracting threshold at a level exceeding the allowable amount of transmission in the graytone part.

According to Arrangement 5, when the graytone part is an area wherein a translucent film capable of controlling the amount of light transmitted through the film is formed, it is possible to make sure an amount of transmission in the graytone part by setting a defect extracting threshold at a level exceeding an allowable amount of transmission in the graytone part; pinholes being also made detectable thereby.

According to Arrangement 6, an apparatus comprises means for identifying an area being subjected to inspection between an area covering a opaque and a transmission part and an area covering a graytone part and means for deciding which one of thresholds between thresholds for extracting defects in the opaque and transmission parts and a threshold for extracting a defect in the graytone part in accordance with the decision thus made. The apparatus therefor is thus capable of automatically and collectively inspecting a graytone mask having the opaque and transmission parts and the graytone part.

According to Arrangement 7, though a graytone part may be inspected visually by using a microscope though it takes a certain degree of trouble and time because an ordinary semiconductor graytone mask is small in size. In the case of producing a graytone mask for LCD such as a graytone mask for TFT (e.g., a thin-film transistor) and producing a graytone mask for a display unit such as PDP, as these masks are large in size and there develop many defects therein and this makes it practically difficult to inspect the masks through the inspection method like this that imposes a heavy inspecting burden. Therefore, the method of defect inspection according to the invention is essential to making graytone masks for LCDs fit for practical use.

BRIEF DESCRIPTION OF THE DRAWINGS

FIG. 3 is a drawing illustrating a procedure for deciding a defect by using one of the thresholds.

FIG. 4A is a partial plan view; and FIG. 4B, a partial sectional view.

DESCRIPTION OF THE PREFERRED EMBODIMENTS

A description will now be given of a method of defect inspection of a graytone mask having a graytone part and an apparatus therefor by way of example.

Figure 1A:
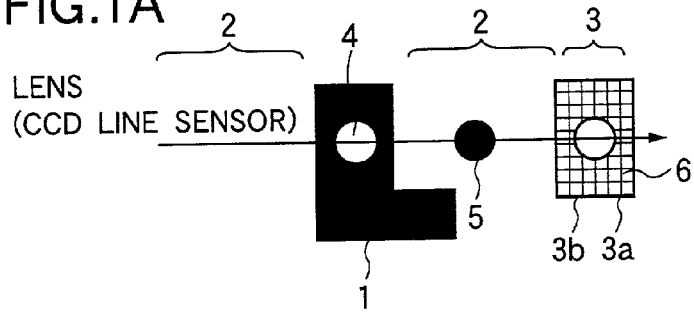
FIG. 1A, FIG. 1B, FIG. 1C, FIG. 1D and FIG. 1E are drawings illustrating a method of defect inspection embodying the invention.

FIG. 1A shows a condition in which a clear defect 4 (pinhole) is produced in a opaque part 1; a opaque defect 5 (spot) in a transmission part 2; a clear defect 6 (pattern omission) in a graytone part 3 with an arrow for use in scanning one of the lenses (upper lens) of a comparative inspection apparatus.

Figure 1B:
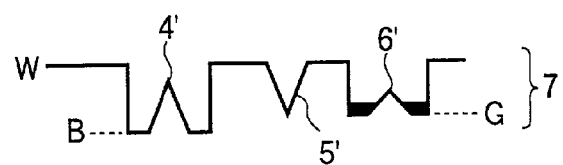

FIG. 1B shows an amount-of-transmission signal 7 obtainable along the scanning line. The levels of the amount-of-transmission signal 7 is indicated by B in the opaque part 1, W in the transmission part 2 and G in the graytone part 3 with a transmittance of 0% and 100% respectively set in the opaque part 1 and the transmission part 2. The amount-of-transmission signal 7 basically comprises pattern edge line signals (pattern form signals) produced by the edges of the pattern (in each of the boundaries in the opaque, the transmission and the graytone parts). With the appearance of a defect thus produced, there appear a clear defect signal 4' in the opaque part 1, a opaque defect signal 5' in the transmission part 2 and a clear defect signal 6' in the graytone part 3.

Figure 1C:
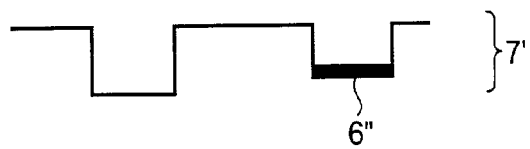
Figure 5:
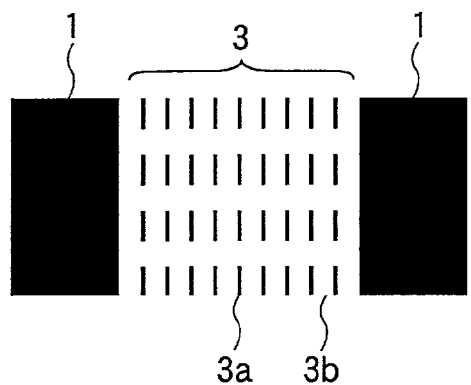
FIG. 5 is a partial plan view illustrating another aspect of the graytone part.

FIG. 1C shows an amount-of-transmission signal 7' obtainable at the other lens (lower lens) when no defect is produced in the same pattern as that of FIG. 1A. As the graytone part 3 has an extremely small L & S pattern, a base signal level 6" (noise band) characteristic of the graytone part as shown in FIG. 5 is generated as what corresponds to the microscopic pattern.

Figure 1D:
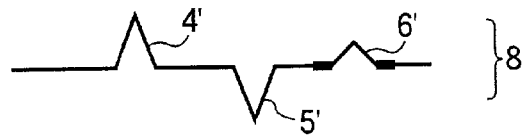

FIG. 1D shows a difference signal obtainable by subtracting the amount-of-transmission signal obtained at each lens. More specifically, this is the difference signal 8 obtained by subtracting the amount-of-transmission signal 7' of FIG. 1C from the amount-of-transmission signal 7 of FIG. 1B. In the difference signal 8, only defect signals 4', 5' and 6' are extracted by removing a pattern edge line signal from the amount-of-transmission signal of each lens.

Figure 1E:
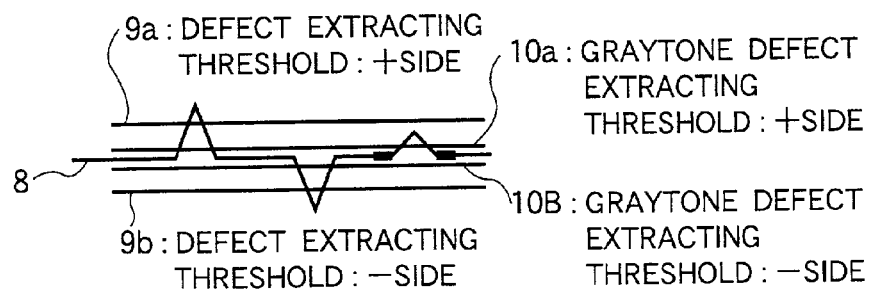
Figure 2:
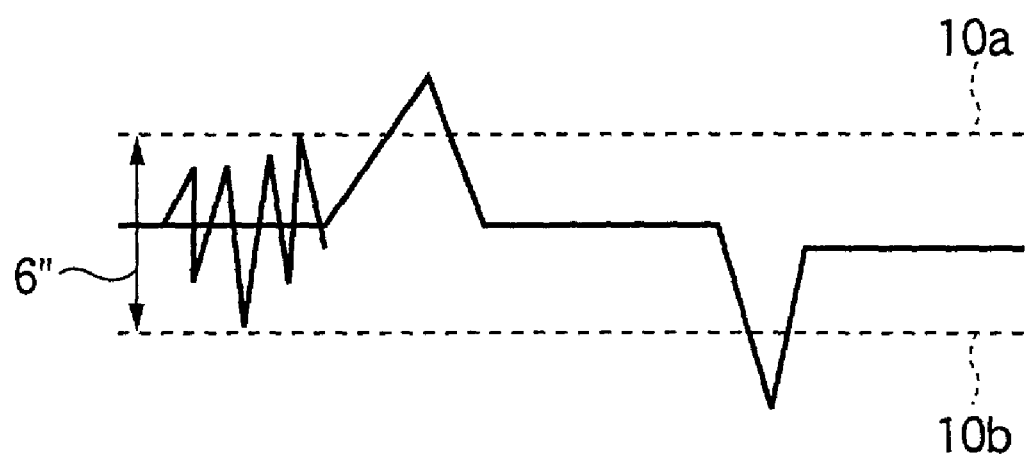
FIG. 2 is a drawing illustrating a base signal level characteristic of a graytone part.
Figure 4A:
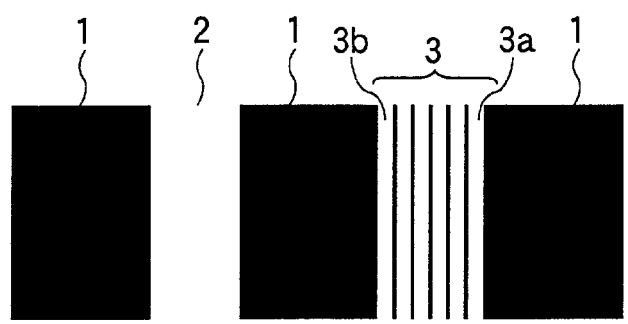
FIGS. 4A and 4B are drawings illustrating a graytone mask.
Figure 4B:
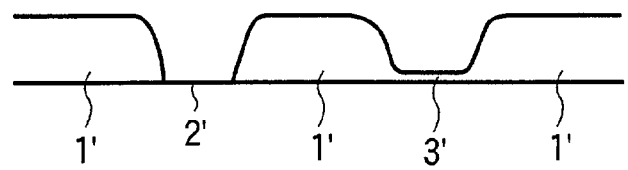

In FIG. 1E, there are shown, in the difference signal 8 used to extract only defect signals, set thresholds necessary for extracting defects in the opaque part 1 and the transmission part 2 (on plus side 9a and minus side 9b) and thresholds necessary for extracting defects in the graytone part 3 (on plus side 10a and minus side 10b). However, the graytone mask cannot be inspected by setting only different thresholds and this is because false defects in opaque and transmission parts are picked up at the threshold necessary for extracting a defect in the graytone part 3 as described above.

According to the invention, the transmittance is used to decide whether an area being subjected to inspection (scanning) is the opaque and transmission parts 1 and 2 or the graytone part 3 and by using either thresholds necessary for extracting defects in the opaque and transmission parts or what is especially necessary for extracting a defect in the graytone part, it is possible to collectively inspect the graytone mask having the opaque and transmission parts and the graytone part. Moreover, a graytone mask having only a graytone part can be inspected without changing the threshold and this makes it also possible to inspect an ordinary mask having a opaque part and an transmission part in addition to a mask having a opaque part, a transmission part and a graytone part in combination.

In case where the graytone part is an area wherein a opaque pattern of not exceeding the resolution limit of an exposure apparatus using a graytone mask is formed, thresholds (10a on the plus side and 10b on the minus side) are set at a level exceeding the base signal level 6" characteristic of the graytone part, whereby the influence of the base signal level characteristic of the graytone part can be eliminated. In this case, the defect extracting threshold may preferably be set with the base signal level 6" as a central reference. Moreover, the amount of transmission in the graytone part can be assured by setting the defect extracting threshold at a level exceeding the allowable amount of transmission in the graytone part.

In case where the graytone part is an area wherein a translucent film capable of controlling the amount of light transmitted through the film is formed, a defect extracting threshold is set at a level exceeding the allowable amount of transmission in the graytone part, whereby the amount of transmission in the graytone part can be assured and moreover pinholes as well as half-defects are made detectable thereby.

A comparative inspection apparatus according to the invention will now be described.

The comparative inspection apparatus according to the invention has a means for detecting an amount-of-transmission signal by scanning the same pattern formed in a mask with parallel light sources and light receiving lenses. More specifically, the comparative inspection apparatus has, for example, the parallel light sources (spot light sources corresponding to the respective lenses or a light source for irradiating the whole surface of the mask) provided on one side of the mask, and two lenses provided on the other side of the mask and a means for scanning the whole mask area by relatively moving the mask and the lenses. With this arrangement, the same pattern portion formed in the mask is scanned and the light transmitted therethrough is received by the lenses. Further, a CCD line sensor disposed in each lens unit is used to detect the amount-of-transmission signal. There is also provided a mechanism for positioning each lens in the same pattern portion formed in the mask.

The means for comparing amount-of-transmission signals is a circuit (difference circuit) for obtaining a difference signal by subtracting one signal from another one.

A means for identifying an area being subjected to inspection between the area covering the opaque and transmission parts and what covers the graytone part is a circuit for deciding which one of the areas is being inspected according to the amount-of-transmission signal, for example, on condition that the level of the amount-of-transmission signal at any one of the lenses is a opaque part level (transmittance at 0%), a transmission part level (transmittance at 100%) or a graytone level (transmittance at about 50%). This circuit generates a trigger signal for distributing a threshold depending on the area subjected to inspection. Although such an area may be decided from the level of the amount-of-transmission signal at one of the lenses, it is preferred to decide the area according to the information from both lenses in consideration of a possible error in decision-making in case where that lens is receiving light from a defective portion.

Referring to FIG. 3, there is shown therein threshold distribution. When the transmittance signal level at any one of the lenses is the opaque part level, the transmission part level or the graytone level, a decision is made on the fact that the corresponding area is being subjected to inspection. At this time, a trigger signal for distributing thresholds, for example, is generated depending on the inspection area. The difference signal is distributed by the trigger signal to a defect detection circuit having a graytone defect extracting threshold or a defect detection circuit having a normal defect extracting threshold, so that the presence of a defect is decided by the defect detection circuit with the threshold thus distributed. In the defect detection circuit having the normal defect extracting threshold, the presence of a defect is normally decided when the difference signal exceeds a defect extracting threshold for the opaque and transmission parts. In the defect detection circuit having the graytone defect extracting threshold, the presence of a defect is decided when the difference signal exceeds the defect extracting threshold specifically for the graytone part. In each of the defect detection circuits, the threshold may be set at any desired value and automatic defect inspection is also possible.

In this case, the difference signal may be sent to both the circuits so as to use the trigger signal for turning on and off each of the defect detection circuit.

In order to make sure that what kind of defect is produced in which one of the lenses, a lower lens signal is compared with an upper lens signal in an upper lens circuit (the lower lens signal is subtracted from the upper lens signal), for example. As a defect signal appears on the plus side when a clear defect is produced in the opaque part 1 or the graytone part 3 of the upper lens and a defect signal appears on the minus side when a opaque defect is produced in the transmission part 2 or the graytone part 3 of the upper lens, whereby the clear and opaque defects of the upper lens are detected (FIG. 1B-(5)). Similarly, an upper lens signal is compared with a lower lens signal in a lower lens circuit (the upper lens signal is subtracted from the lower lens signal), for example. As a defect signal appears on the plus side when a clear defect is produced in the opaque part 1 or the graytone part 3 of the lower lens and a defect signal appears on the minus side when a opaque defect is produced in the transmission part 2 or the graytone part 3 of the lower lens, whereby the clear and opaque defects of the lower lens are detected.

Incidentally, the invention is not limited to the above-described embodiment thereof.

Figure 6:
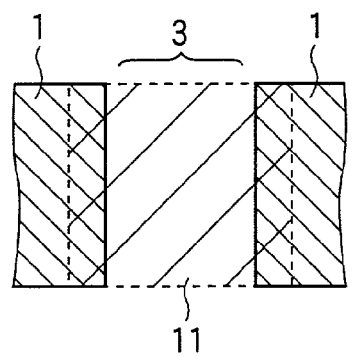
FIG. 6 is a partial plan view illustrating still another aspect of the graytone part.
Figure 7A:
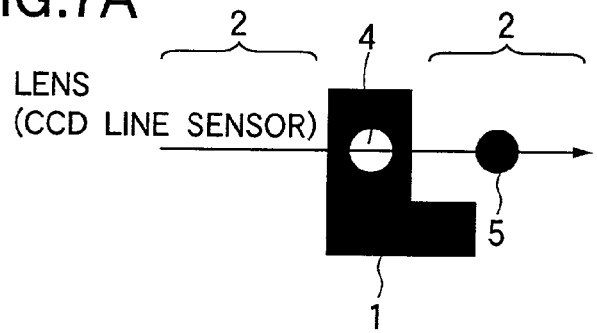
FIG. 7A, FIG. 7B, FIG. 7C, FIG. 7D and FIG. 7E are drawings illustrating a conventional method of defect inspection.
Figure 7B:
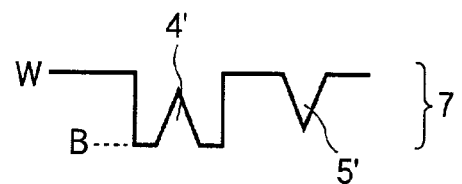
Figure 7C:
Figure 7D:
Figure 7E:
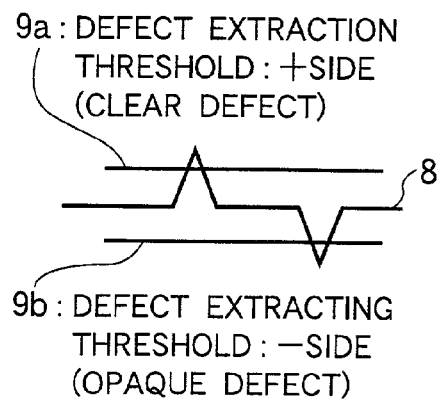

For example, the invention is applicable to cases where the opaque pattern 3a in the graytone part 3 is of a dotted line type as shown in FIG. 5 and where the graytone part 3 is formed of a translucent film 11 as shown in FIG. 6.

Moreover, the invention is also applicable to not only an apparatus of such a type that a pattern signal obtainable from one lens is compared with data on designing patterns but also an apparatus of such a type that a mask is placed vertically or horizontally before being inspected.

Further, the means for identifying an area being subjected to inspection between the area covering the opaque and transmission parts and the area covering the graytone part may employ reflected light (a reflectance signal).

As set forth above, the method of defect inspection of a graytone mask and an apparatus doing the same according to the invention is thus capable of accurately and collectively inspecting the graytone mask having the opaque and transmission parts and the graytone part to ensure that any defect of the whole mask including the graytone part can be inspected.

In particular, the method of inspection according to the invention is necessary for and essential to making graytone masks for LCDs fit for practical use.

What is claimed is:

1. A method of defect inspection of a graytone mask having a opaque part, a transmission part and a graytone part which is an area wherein the amount of light transmitted therethrough is regulated, and aimed at selectively varying the thickness of a photoresist film by decreasing the amount of light transmitted through said area, the method being characterized by distinguishing the first area wherein the opaque part and the transmission part are formed from the second area wherein the graytone part is formed whereby to inspect each of the areas by using defect inspection means fit for inspecting each of the areas, said distinguishing being performed based on a difference of transmission signal level of the first and the second area.

2. A method of defect inspection as claimed in claim 1 is characterized in that the graytone part is an area wherein a opaque pattern of not exceeding the resolution limit of an exposure apparatus using the graytone mask is formed.

3. A method of defect inspection of a gray tone mask having a opaque part, a transmission part and a graytone part which is an area wherein the amount of light transmitted therethrough is regulated and aimed at selectively varying the thickness of a photoresist film by decreasing the amount of light transmitted through said area, the method being characterized in that: a comparative inspection technique for detecting defects by comparing similar patterns formed in the mask is employed;

that as thresholds of information appearing according to the pattern difference, a special graytone-defect extracting threshold in addition to thresholds for extracting ordinary defects in the opaque and transmission parts is newly provided;

and that by distinguishing a case of inspecting a first area wherein the opaque and transmission parts are formed from a case of inspecting a second area wherein the graytone part is formed, so that inspection is made by using the thresholds for extracting ordinary defects in the opaque and transmission parts in the case of inspecting the opaque and the transmission parts and that inspection is made by using the special graytone-defect extracting threshold in the case of inspecting the graytone part, said distinguishing being performed based on a difference of transmission signal level of the first and second area.

4. A method of defect inspection as claimed in claim 3 is characterized in that the graytone part is an area wherein a opaque pattern of not exceeding the resolution limit of an exposure apparatus using the graytone mask is formed and that the defect extracting threshold is set at a level exceeding a base signal level characteristic of the graytone part.

5. A method of defect inspection as claimed in claim 3 is characterized in that the graytone part is an area wherein a translucent film capable of controlling the amount of light transmitted through the film is formed and that a defect extracting threshold is set at a level exceeding an allowable amount of transmission in the graytone part.

6. An apparatus for defect inspection of a graytone mask having a opaque part, a transmission part and a graytone part which is an area wherein the amount of light transmitted therethrough is regulated and aimed at selectively varying the thickness of a photoresist film by decreasing the amount of light transmitted through said area, the apparatus comprising:

means for detecting amount-of-transmission signals by scanning similar pattern portions formed in the mask with parallel light sources and light receiving lenses and means for obtaining a difference signal by comparing the amount-of-transmission signals;

means for identifying an area being subjected to inspection between a first area covering the opaque and transmission parts and a second area that covers the graytone part;

means for deciding the presence of defects in the opaque and transmission parts in case where the difference signal exceeds the defect extracting threshold for the opaque and transmission parts by using the defect extracting threshold therefor when it is decided that the opaque and transmission parts are being subjected to inspection; and means for deciding the presence of a defect in the graytone part in case where the difference signal exceeds the special defect extracting threshold for the graytone part by using the special defect extracting threshold therefor when it is decided that the graytone part is being subjected to inspection.

7. A method of defect inspection as claimed in claim 1, wherein the graytone mask is a mask for use in producing a display unit.

8. A method of defect inspection as claimed in claim 3, wherein the graytone mask is a mask for use in producing a display unit.

9. A method of producing a graytone mask, further comprising the step of defect inspection using the method of defect inspection as claimed in claim 1.

10. A method of producing a graytone mask, further comprising the step of defect inspection using the method of defect inspection as claimed in claim 3.

* * * * *